United States Patent
Ikeda

(10) Patent No.: US 7,122,477 B2
(45) Date of Patent: Oct. 17, 2006

(54) METHOD OF PLASMA TREATMENT

(75) Inventor: Taro Ikeda, Nirasaki (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 10/489,423

(22) PCT Filed: Sep. 11, 2002

(86) PCT No.: PCT/JP02/09289

§ 371 (c)(1),
(2), (4) Date: Mar. 12, 2004

(87) PCT Pub. No.: WO03/026004

PCT Pub. Date: Mar. 27, 2003

(65) Prior Publication Data

US 2004/0242012 A1    Dec. 2, 2004

(30) Foreign Application Priority Data

Sep. 12, 2001    (JP) .............................. 2001-276667

(51) Int. Cl.
*H01L 21/461* (2006.01)
*H01L 21/302* (2006.01)

(52) U.S. Cl. ...................... 438/706; 438/714; 438/715; 438/719; 438/720; 438/721

(58) Field of Classification Search ................ 438/706, 438/714, 715, 719–722
See application file for complete search history.

(56) References Cited

U.S. PATENT DOCUMENTS 6,346,489 B1    2/2002 Cohen et al.
6,388,875 B1 *  5/2002 Chen .......................... 361/685
2001/0015261 A1 * 8/2001 Kobayashi et al. ......... 156/345
2002/0106908 A1   8/2002 Cohen et al
2002/0185229 A1 * 12/2002 Brcka et al. ........... 156/345.48

(Continued)

FOREIGN PATENT DOCUMENTS

JP           55-117241         9/1980

(Continued)

OTHER PUBLICATIONS

Communication in Cases for Which No Other Form is Applicable (PCT/IB/345) issued in connection with PCT/JP2002/009289 (Jul. 1992).

(Continued)

*Primary Examiner*—Duy-Vu N Deo
(74) *Attorney, Agent, or Firm*—Smith, Gambrell & Russell, LLP

(57) ABSTRACT

The present invention is a plasma processing method including: a step of introducing a substrate into a processing container, a metal or metallic compound film being formed on a surface of the substrate; a step of supplying a noble gas and an $H_2$ gas into the processing container; and a step of generating plasma in the processing container while the noble gas and the $H_2$ gas are supplied, so that a natural oxide film formed on a surface of the metal or metallic compound film is removed by means of the plasma. According to the invention, the noble gas and the $H_2$ gas are supplied into the processing container, the plasma is generated in the processing container, and the plasma acts on the natural oxide film formed on a surface of the metal or metallic compound film. Thus, active hydrogen in the plasma reduces the natural oxide film, and active species of the noble gas etch the natural oxide film. As a result, the natural oxide film can be removed with a satisfactory selective ratio.

7 Claims, 4 Drawing Sheets

U.S. PATENT DOCUMENTS

2003/0017628 A1 * 1/2003 Li et al. .................. 438/14
2003/0148621 A1 * 8/2003 Takagi .................. 438/706
2004/0194340 A1 * 10/2004 Kobayashi ............ 34/630

FOREIGN PATENT DOCUMENTS

| JP | 04-336426 | | 11/1992 |
|----|-----------|---|---------|
| JP | 04-171744 | | 6/1995 |
| JP | 10-270381 | * | 10/1998 |
| JP | 11-026397 | * | 1/1999 |
| JP | 11-26397 | | 1/1999 |
| JP | 11-204455 | | 7/1999 |
| JP | 11-260913 | * | 9/1999 |
| JP | 2000-031092 | | 1/2000 |
| JP | 2000-332106 | | 11/2000 |
| JP | 2001-168075 | | 6/2001 |
| JP | 2001-203194 | | 7/2001 |

OTHER PUBLICATIONS

Notice Informing the Applicant of the Communication of the International Application to the Designated Offices (Corrected Version) Form PCT/IB/308; issued in connection with PCT/JP2002/009289 (Apr. 2002).

International Preliminary Examination Report (PCT/IPEA/409) (translated) issued for PCT/JP02/09289.

Notification of Transmittal of Copies of Translation of the International Preliminary Examination Report (PCT/IB/338).

* cited by examiner

METHOD OF PLASMA TREATMENT

FIELD OF THE INVENTION

The present invention relates to a plasma processing method that is used to remove a natural oxide film formed on a metal film or a metallic compound film, in particular on a $CoSi_2$ film, of a surface of a substrate.

DESCRIPTION OF THE RELATED ART

In a semiconductor manufacturing process, a Ti film is deposited on a bottom of a contact hole formed in a silicon wafer as an object to be processed. A barrier layer such as TiN is formed on a TiSi layer, which is formed by interdiffusion of the Ti film and the silicon wafer. In addition, an Al layer, a W layer, a Cu layer or the like is formed on the barrier layer. Thereby, filling of the contact hole and forming of wirings are carried out. Conventionally, a metal-deposition system having a plurality of chambers is used for carrying out the above successive steps. In such a metal-deposition system, in order to obtain good electrical contacts, prior to the deposition process, a process for removing a natural oxide film formed on the silicon wafer, that is, a pre-clean process is carried out.

The pre-clean process is a process wherein plasma of a process gas is generated in a chamber assembled in the metal-deposition system and wherein the natural oxide film formed on the silicon wafer is removed by the plasma. According to the pre-clean process, the natural oxide film can be removed in an in-line manner and relatively easily.

On the other hand, recently, miniaturization of semiconductor devices has been advanced. For example, if the diameter of a hole is 0.15 μm or smaller, it is desired to further lower the resistance of wiring contact portions. Conventionally, TiSi is used as a material for the contact portions. Recently, instead of TiSi, a $CoSi_2$ film, whose resistance is low, is formed on Si, and then Ti is formed thereon. In that case, a natural oxide film may be formed on a surface of the $CoSi_2$ film. The natural oxide film may cause higher resistance of the contact portions. Thus, if a pre-clean process is conducted to efficiently remove the natural oxide film on the surface of the $CoSi_2$ film without giving any damage and with a good selective ratio, this is very advantageous in the semiconductor manufacturing process.

However, when the natural oxide film on the $CoSi_2$ film is removed by the conventional pre-clean process, the etching selective ratio may not be sufficient. In addition, in a method of removing the natural oxide film on the $CoSi_2$ film by means of a process such as a wet processing by an HF aqueous solution, the whole exposed surface and the lateral wall of the hole or the like are subjected to an isotropic etching. Thus, it is difficult to use this method for recent miniaturized devices.

Thus, it is required to achieve a plasma process wherein the natural oxide film on the $CoSi_2$ film is efficiently removed with a high selective ratio while less damage is given to the $CoSi_2$ film.

In addition, with respect to a natural oxide film on a surface of any metal or metallic compound film other than the $CoSi_2$ film as well, if the natural oxide film can be efficiently removed with a high selective ratio by means of a pre-clean process by plasma, this is very advantageous in the semiconductor manufacturing process.

SUMMARY OF THE INVENTION

This invention is developed by focusing the aforementioned problems in order to resolve them effectively. An object of the present invention is to provide a plasma processing method wherein a natural oxide film on a metal or metallic compound film, in particular a $CoSi_2$ film, can be efficiently removed with a sufficient selective ratio.

The present invention is a plasma processing method comprising: a step of introducing a substrate into a processing container, a metal or metallic compound film being formed on a surface of the substrate; a step of supplying a noble gas and an $H_2$ gas into the processing container; and a step of generating plasma in the processing container while the noble gas and the $H_2$ gas are supplied, so that a natural oxide film formed on a surface of the metal or metallic compound film is removed by means of the plasma.

According to the present invention, the noble gas and the $H_2$ gas are supplied into the processing container, the plasma is generated in the processing container, and the plasma acts on the natural oxide film formed on a surface of the metal or metallic compound film. Thus, active hydrogen in the plasma reduces the natural oxide film, and active species of the noble gas etch the natural oxide film. As a result, the natural oxide film can be removed with a satisfactory selective ratio.

The metal or metallic compound may consist of any of $CoSi_2$, Co, W, WSi, Cu, Si, Al, Mo, MoSi, Ni and NiSi. It is preferable that an etching selective ratio of the natural oxide film with respect to the metal or metallic compound film is 3 or more.

It is preferable that the plasma is one of inductive coupling plasma, helicon wave plasma and microwave plasma. Such plasma can be generated independently from a bias-voltage control of a lower electrode for drawing-in the plasma. Thus, the natural oxide film can be removed while less damage is given to the metal or metallic compound film by ions.

In addition, the present invention is a plasma processing method comprising: a step of introducing a substrate into a processing container, a $CoSi_2$ film being formed on a surface of the substrate; a step of supplying a noble gas and an $H_2$ gas into the processing container; and a step of generating inductive coupling plasma in the processing container and applying a bias voltage to the substrate while the noble gas and the $H_2$ gas are supplied, so that a natural oxide film formed on a surface of the $CoSi_2$ film is removed by means of the plasma.

According to the present invention, the noble gas and the $H_2$ gas are supplied into the processing container, the inductive coupling plasma is generated in the processing container, and the plasma acts on the natural oxide film formed on a surface of the $CoSi_2$ film. Thus, active hydrogen in the plasma reduces the natural oxide film, and active species of the noble gas etch the natural oxide film. As a result, the natural oxide film formed on the surface of the $CoSi_2$ film can be removed with a satisfactory selective ratio and without giving any damage by ions to the $CoSi_2$ film. In the case, it is preferable that an etching selective ratio of the natural oxide film with respect to the $CoSi_2$ film is 3 or more.

Preferably, in the step of supplying a noble gas and an $H_2$ gas into the processing container, the $H_2$ gas is supplied in such a manner that an amount of the $H_2$ gas is 20% or more with respect to a total amount of the noble gas and the $H_2$ gas. Further preferably, in the step of supplying a noble gas and an $H_2$ gas into the processing container, the $H_2$ gas is supplied in such a manner that an amount of the $H_2$ gas is 40% or more with respect to a total amount of the noble gas and the $H_2$ gas.

In addition, preferably, the noble gas is at least one of Ar, Ne, He, Kr and Xe.

DESCRIPTION OF THE PREFERRED EMBODIMENT

Hereinafter, embodiments of the present invention will be described with reference to the attached drawings.

Figure 1:
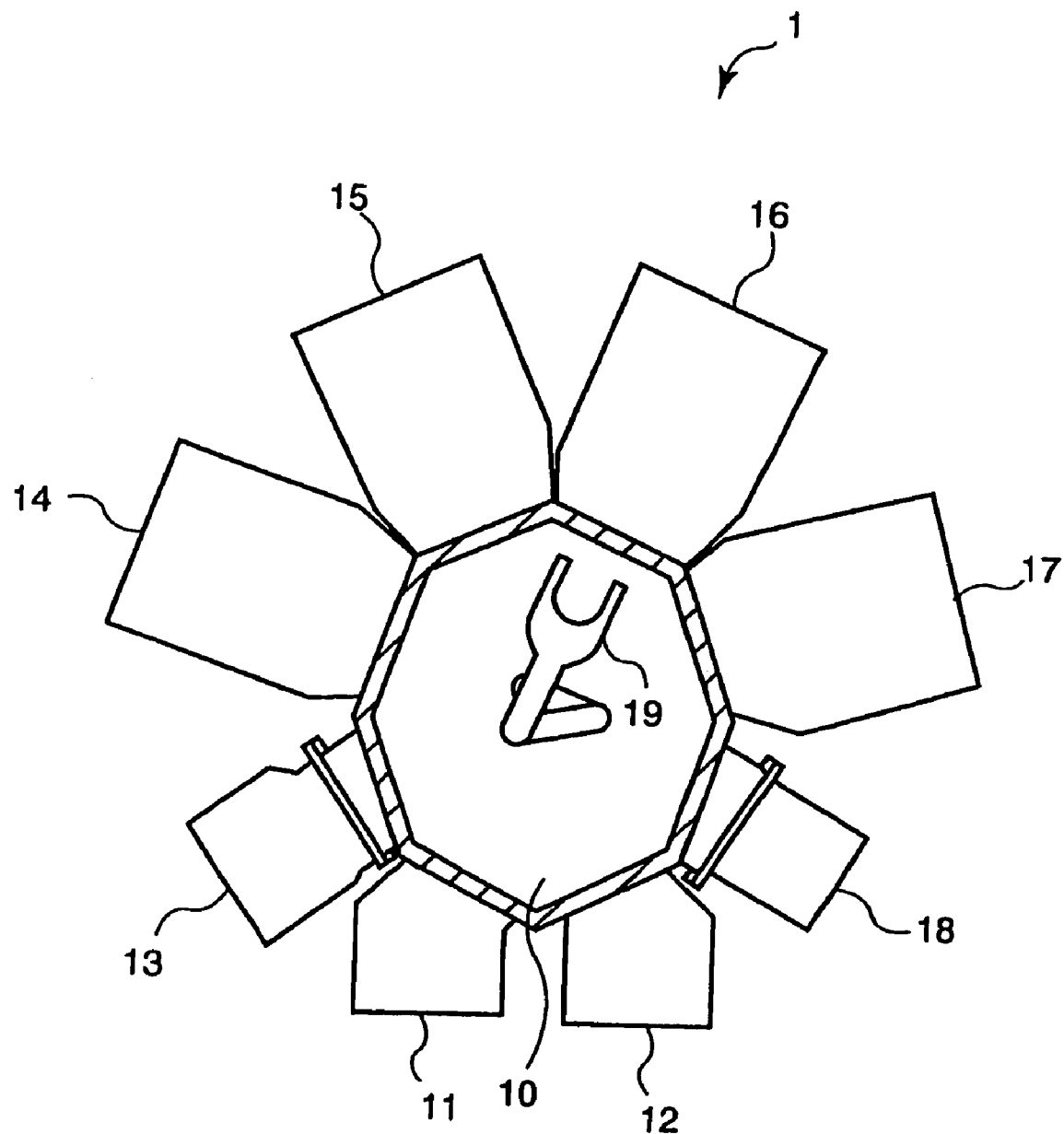
FIG. 1 is a schematic structural view showing a metal-deposition system including a pre-clean processing unit wherein a plasma processing method according to an embodiment of the present invention is carried out.

FIG. 1 is a schematic structural view showing a metal-deposition system including a pre-clean processing unit wherein a plasma processing method according to an embodiment of the present invention is carried out. In the metal-deposition system 1, a transfer chamber 10 is arranged at a central position thereof. Two cassette chambers 11 and 12, a degassing chamber 13, a Ti depositing unit 14, a pre-clean processing unit 15, a TiN depositing unit 16, an Al depositing unit 17 and a cooling chamber 18 are provided around the transfer chamber 10. That is, the metal-deposition system 1 is a multi-chamber type of cluster-tool system.

In the metal-deposition system 1, a barrier layer is formed on a $CoSi_2$ film on a silicon wafer W (hereinafter, which is referred to as merely a wafer), the silicon wafer W having a contact hole or a via hole, the $CoSi_2$ film being formed on the hole portion (contact portion). In addition, an Al (aluminum) layer is formed on the barrier layer. Thereby, filling of the hole and forming of an Al wiring are carried out. Specifically, a single wafer W is taken out from the cassette chamber 11 by means of a transfer arm 19, and then introduced into the pre-clean processing unit 15 through the transfer chamber 10. The pre-clean processing unit 15 removes a natural oxide film formed on the $CoSi_2$ film at the contact portion (which is described below in detail). The wafer W is then transferred to the degassing chamber 13 by the transfer arm 19. A degassing process is carried out to the wafer W in the degassing chamber 13. Alternatively, without the degassing process in the degassing chamber 13, the wafer W may be directly transferred to the Ti depositing unit 14.

Then, the wafer W is introduced into the Ti depositing unit 14. The Ti depositing unit 14 deposits a Ti film on the $CoSi_2$ film by means of, for example, a plasma CVD process using an $H_2$ gas, an Ar gas and a $TiCl_4$ gas. After the Ti film is deposited, the wafer W is introduced into the TiN depositing unit 16. The TiN depositing unit 16 deposits a TiN film by means of, for example, a plasma CVD process using an $N_2$ gas or an $NH_3$ gas, an Ar gas and a $TiCl_4$ gas, in order to form a barrier layer. Alternatively, the TiN film may be deposited by means of a thermal CVD process using an $N_2$ gas, an $NH_3$ gas and a $TiCl_4$ gas. Then, the Al depositing unit 17 forms an Al layer on the barrier layer. By the above steps, a predetermined depositing process is completed. Then, the wafer W is cooled in the cooling chamber 18, and sent to the cassette chamber 12.

The arrangement of the chambers 14 to 17 is freely determined. The number of respective chambers is determined taking into consideration the number of processes to the wafer and throughput thereof. For example, the chambers 14 and 15 may be pre-clean chambers, the chamber 16 may be a Ti depositing chamber, and the chamber 17 may be a TiN depositing chamber. Alternatively, the chamber 14 may be a pre-clean chamber, the chambers 15 and 16 may be Ti depositing chambers, and the chamber 17 may be a TiN depositing chamber.

As described above, a semiconductor device can be manufactured, the semiconductor wafer including, for example, a wafer W having a contact hole reaching an impurity diffusion region and provided with an interlayer insulating film, a $CoSi_2$ film formed on the impurity diffusion zone in the contact hole, a barrier layer formed on the $CoSi_2$ film, and a metal layer formed on the barrier layer to electrically communicate with the impurity diffusion region on a substrate.

In the metal-deposition system 1 of the present embodiment, a vacuum state is maintained in the transfer chamber 10. Thus, after the natural oxide film on the $CoSi_2$ film is removed by the pre-clean processing unit 15, the wafer W can be subjected to the deposition process of the Ti film in the Ti depositing unit 14 without being exposed to the atmospheric air. That is, a natural oxide film can not be formed again on the $CoSi_2$ film before the Ti film is deposited. Thereby, the interface between the Ti film deposited by the Ti depositing unit 14 and the $CoSi_2$ film is formed satisfactorily, which may improve electrical characteristics thereof.

Figure 2:
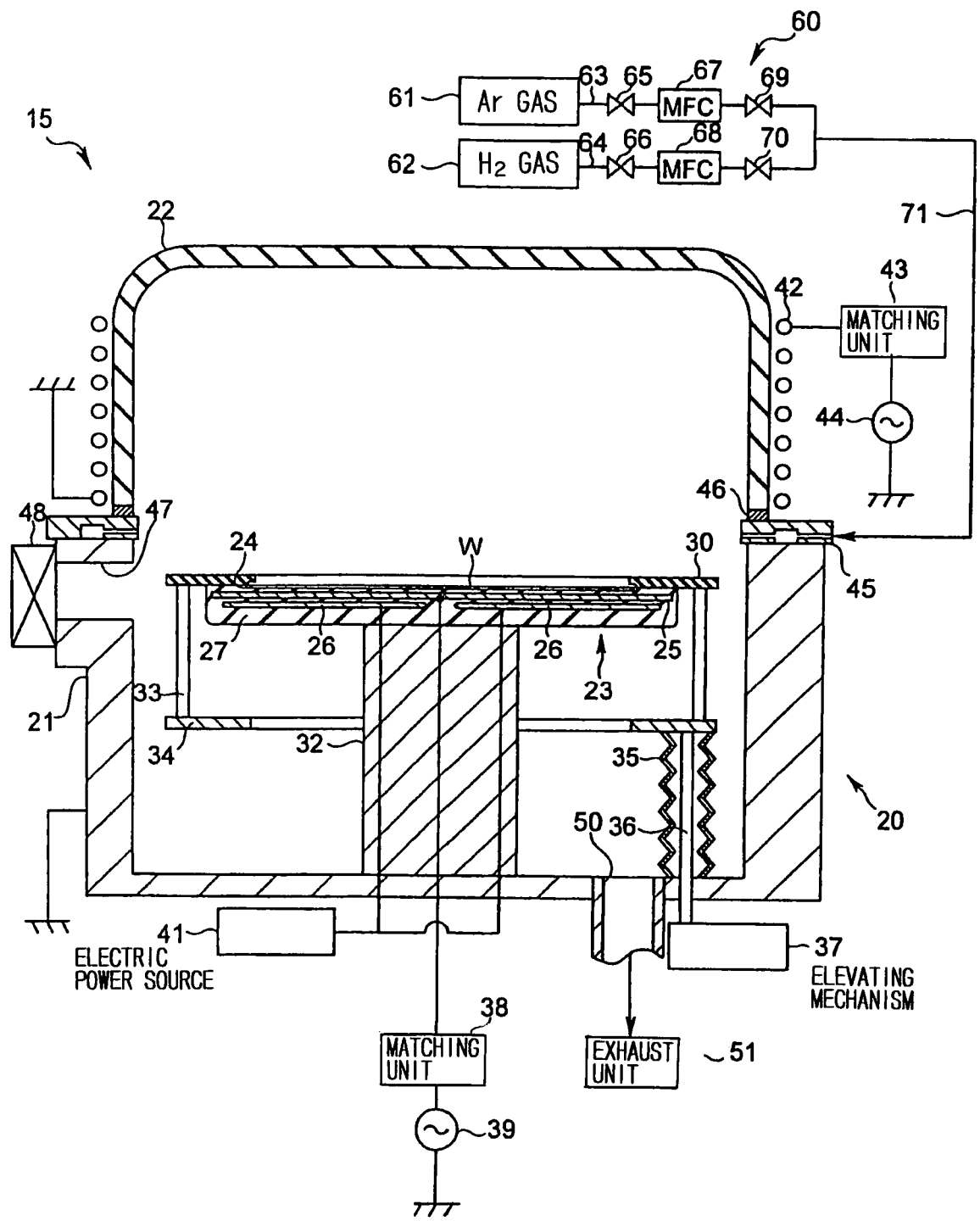
FIG. 2 is a schematic sectional view of the pre-clean processing unit shown in FIG. 1.

Next, the pre-clean processing unit 15 included in the above metal-deposition system 1 is explained in detail. FIG. 2 is a schematic sectional view of the pre-clean processing unit 15. The pre-clean processing unit 15 is formed as an inductive coupling plasma (ICP) etching unit.

As shown in FIG. 2, the pre-clean processing unit 15 includes a processing container 20 having: a cylindrical chamber 21 that has a bottom but whose upper end is open, and a cylindrical bell jar 22 that has a lid, the bell jar 22 being arranged continuously on the chamber 21 via a gas supplying member 45 and a gasket 46.

In the chamber 21, a susceptor (stage for a substrate) 23 for horizontally supporting the wafer W as an object to be processed thereon is supported by a cylindrical supporting member 32. A concave portion 24 that has substantially the same shape as the wafer W is formed on a surface of a susceptor body 27 of the susceptor 23. The wafer W is adapted to be placed on the concave portion 24. Under the concave portion 24, a disk-like meshy lower electrode 25 is buried. A bias voltage may be applied to the lower electrode 25. In addition, a heating member 26 consisting of W, Mo or the like is buried below the lower electrode 25. The susceptor body 27 consists of an insulating material such as ceramics, for example, AlN, $Al_2O_3$ or the like. Thus, the susceptor body 27 and the heating member 26 form a ceramics heater. A direct-current power source 41 is connected to the heating member 26. When the power source 41 supplies electric power to the heating member 26, the heating member 26 is heated and the wafer W may be heated to a predetermined temperature.

In addition, above the susceptor 23, a circular shadow ring 30 made of an insulating material such as quartz, AlN, $Al_2O_3$ or the like is arranged so as to cover the edge of the wafer W placed on the concave portion 24. The shadow ring 30 is connected to a circular member 34 via a supporting pillar 33 that is connected to a lower surface of the shadow ring 30. The circular member 34 is connected to an elevating mechanism 37 via a rod member 36. When the rod member 36 is moved up and down by the elevating mechanism 37, the circular member 34, the supporting pillar 33 and the shadow ring 30 are integrally moved up and down. The rod member 36 is surrounded by a bellows 35. Thus, it is prevented that the atmosphere in the processing container 20 leaks outside from a vicinity of the rod member 36.

The shadow ring 30 have a function to mask the edge of the wafer W and a function as a focus ring for generating density-uniform plasma above the surface of the wafer W. The shadow ring 30 is moved up to a predetermined position when the wafer W is transferred into the chamber 21 and passed onto wafer supporting pins (not shown) that extend through the susceptor 23 and can be moved up and down. On the other hand, after the wafer W is passed on the wafer supporting pins, when the wafer W is placed onto the susceptor 23, the shadow ring 30 is moved down together with the wafer supporting pins.

The above lower electrode 25 is connected to a high-frequency electric power source 39 of a frequency of for example 13.56 MHz, via a matching unit 38. When the high-frequency electric power source 39 supplies electric power to the lower electrode 25, a predetermined bias voltage is adapted to be applied to the lower electrode 25 (that is, finally the wafer W).

The circular gas supplying member 45 and the gasket 46 are provided between the chamber 21 and the bell jar 22, in order to maintain airtightness. A plurality of gas-discharging holes is formed in the gas supplying member 45 at a substantially even arrangement over the whole circumference thereof. A gas is supplied from a gas supplying mechanism 60 into the processing container 20 through the gas-discharging holes.

In addition, an opening 47 is provided in a lateral wall of the chamber 21. A gate valve 48 is mounted at a position corresponding to the opening 47 outside the chamber 21. Thus, while the gate valve 48 is opened, the wafer W is adapted to be transferred between a load-lock chamber (not shown) and the chamber 21 through the transfer chamber 10.

The bell jar 22 is made of an electrical insulating material such as quartz or ceramics. An inductive coil 42 as an antenna, which is plasma generating means, is wound around the outside periphery of the bell jar 22. The coil 42 is connected to a high-frequency electric power source 44 of a frequency of 450 kHz to 600 MHz, preferably 450 kHz, via a matching unit 43. When the high-frequency electric power source 44 supplies high-frequency electric power to the coil 42 via the matching unit 43, inductive coupling plasma (ICP) is adapted to be generated in the bell jar 22.

The gas supplying mechanism 60 has an Ar gas supplying source 61 that supplies an Ar gas, and an $H_2$ gas supplying source 62 that supplies an $H_2$ gas. The Ar gas supplying source 61 is connected to a gas line 63. On the way of the gas line 63, an open-close valve 65, a mass-flow controller 67 and an open-close valve 69 are provided in the order. In addition, the $H_2$ gas supplying source 62 is connected to a gas line 64. On the way of the gas line 64, an open-close valve 66, a mass-flow controller 68 and an open-close valve 70 are provided in the order. The gas lines 63, 64 are connected to a gas line 71, and the gas line 71 is connected to the gas supplying member 45.

A bottom wall of the chamber 21 is connected to an exhaust pipe 50. The exhaust pipe 50 is connected to an exhaust unit 51 including a vacuum pump. When the exhaust unit 51 is driven, a vacuum of a predetermined level can be maintained in the processing container 20.

Then, an operation of removing a natural oxide film formed on a wafer W by using the above pre-clean processing unit 15 is explained.

At first, the gate valve 48 is opened, and a wafer W is introduced into the chamber 21 by means of the transfer arm 19 provided in the transfer chamber 10 of the metal-deposition system 1. Then, in a state wherein the shadow ring 30 has been moved up, the wafer W is passed onto the wafer supporting pins (not shown) projecting from the susceptor 23. Then, the wafer supporting pins and the shadow ring 30 are moved down, so that the wafer W is placed on the susceptor 23 and the shadow ring 30 masks the outside peripheral edge of the wafer W.

After that, the gate valve 48 is closed, and the atmosphere in the processing container 20 is discharged by the exhaust system 51 to a predetermined reduced-pressure state. In the reduced-pressure state, the Ar gas and the $H_2$ gas are introduced at respective predetermined flow rates from the Ar gas supplying source 61 and the $H_2$ gas supplying source 62 into the processing container 20. At the same time, the high-frequency electric power source 44 starts to supply high-frequency electric power to the coil 42, so that inductive coupling plasma is generated in the bell jar 22. Thus, active species of Ar, $H_2$ and so on are generated. In addition, the high-frequency electric power source 39 supplies high-frequency electric power of for example 450 kHz to 60 MHz, preferably 13.56 MHz, to the susceptor 23. That is, a self-bias voltage is applied to the wafer W. This makes it easier for the active species to be drawn to the wafer W, that is, the reduction and etching process is more efficiently carried out.

In the above state, in order to enhance the reduction force, the heating member 26 is heated by electric power from the electric power source 41 so that the wafer W is heated to 200 to 500° C. Thus, a pre-clean process wherein a natural oxide film on a $CoSi_2$ film formed at a contact portion of the wafer W is reduced, etched and removed is carried out.

Then, a gas-discharging amount by the exhaust system 51 and gas-supplying amounts from the Ar gas supplying source 61 and the $H_2$ gas supplying source 62 are adjusted so that the processing container 20 is returned to the same vacuum level as the transfer chamber 10. Then, the supporting pins project from the susceptor 23 to lift up the wafer W. When the gate valve 48 is opened, the transfer arm 19 goes into the chamber 21 and takes out the wafer W. Then, the steps at the pre-clean processing unit 15 are completed.

According to the above pre-clean process, the natural oxide film on a $CoSi_2$ film may be properly removed. In the case, if the ratio between the Ar gas as a noble gas and the $H_2$ gas is properly adjusted, an etching selective ratio of the natural oxide film with respect to the $CoSi_2$ film can be sufficiently enhanced and damage given to the $CoSi_2$ film as a base layer can be reduced. It is preferable that the etching selective ratio, that is, a ratio between an etching rate of the $CoSi_2$ film and an etching rate of the natural oxide film is 3 or more.

In addition, in the present embodiment, inductive electromagnetic field is generated in the bell jar 22, the inductive coupling plasma that causes less ion-damage to the base layer is generated, and the natural oxide film is removed by the inductive coupling plasma. Thus, damage by ions to the $CoSi_2$ film as the base layer can be further reduced.

Figure 3:
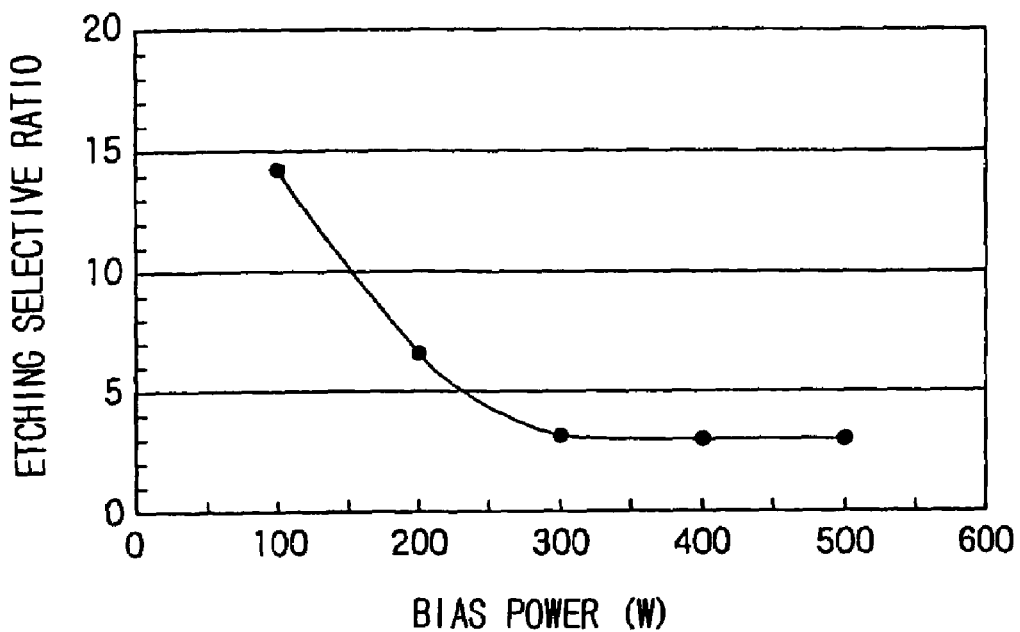
FIG. 3 is a graph showing a relationship between outputs of a high-frequency electric power source and etching selective ratios of an $SiO_2$ film with respect to a $CoSi_2$ film.
Figure 4:
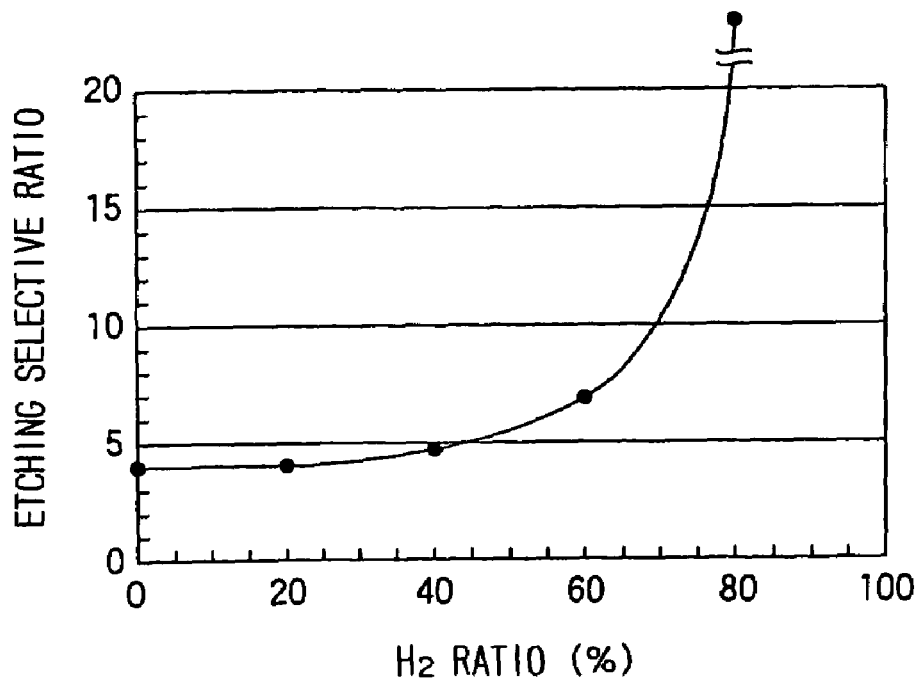
FIG. 4 is a graph showing a relationship between ratios of a flow amount of $H_2$ gas with respect to the total flow amount and etching selective ratios of an $SiO_2$ film with respect to a $CoSi_2$ film.
Figure 5:
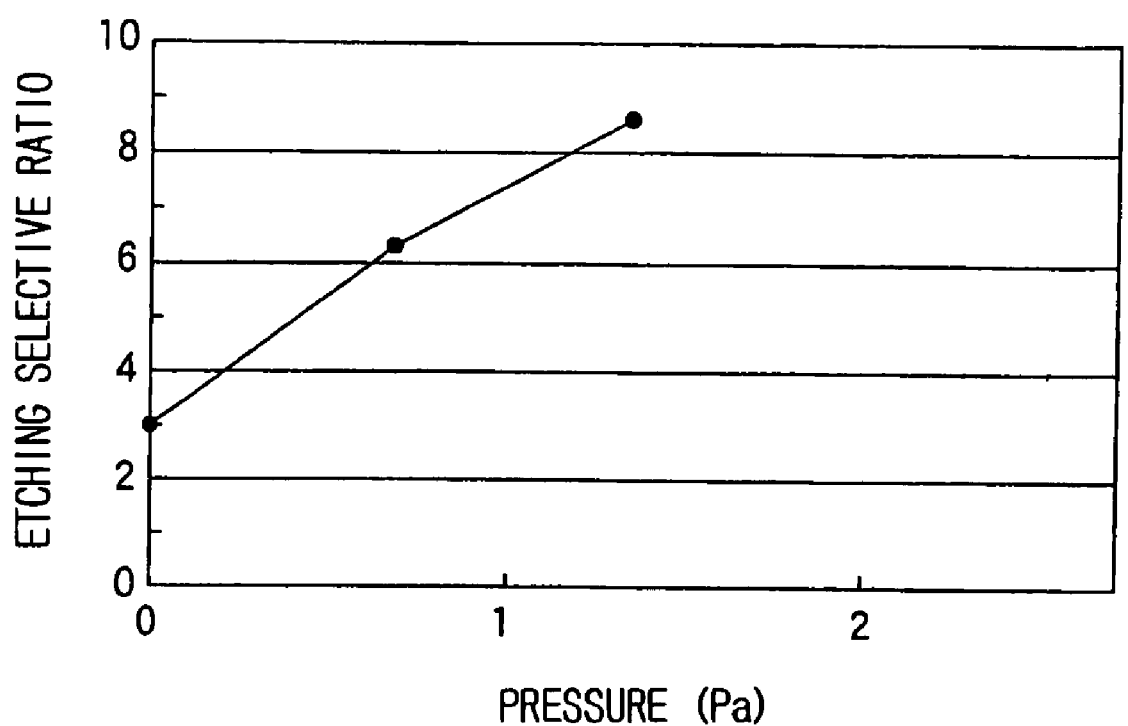
FIG. 5 is a graph showing a relationship between pressures in the processing container and etching selective ratios of an $SiO_2$ film with respect to a $CoSi_2$ film.

Regarding the above pre-clean process, experiments were carried out for investigating effects of process conditions on the etching selective ratio of the $SiO_2$ film with respect to the $CoSi_2$ film. In the experiments, the process conditions were as follows: the Ar gas flow rate and the $H_2$ gas flow rate were 0.008 L/min and 0.012 L/min (8 sccm and 12 sccm); the pressure in the processing container 20 was 0.655 Pa; the temperature of the heated wafer W was 500° C.; the electric power of the high-frequency electric power source 39 was 200 W; the electric power of the high-frequency electric power source 44 was 1000 W; and the time of the pre-clean process was 60 second. While the above values were used as a reference process condition, any of the output of the high-frequency electric power source 39, the $H_2$ gas flow rate and the pressure in the processing container 20 was variously changed and respective etching selective ratios of the $SiO_2$ film with respect to the $CoSi_2$ film (ratio of $SiO_2/CoSi_2$) were measured. The results are shown in FIGS. 3 to 5. FIG. 3 is a graph on which the abscissa represents the output of the high-frequency electric power source 39 (bias power) and the ordinate represents the etching selective ratio. FIG. 4 is a graph on which the abscissa represents the ratio of the $H_2$ gas flow rate with respect to the total gas flow rate and the ordinate represents the etching selective ratio. FIG. 5 is a graph on which the abscissa represents the pressure in the processing container 20 and the ordinate represents the etching selective ratio.

Taking into consideration the results of the experiments, preferable process conditions for the pre-clean process are explained below.

Even if the $H_2$ gas flow rate supplied into the processing container 20 is very small, if the processing time is short, the natural oxide film can be removed with less damage to the $CoSi_2$ film. However, in view of effectively removing the natural oxide film with less damage to the $CoSi_2$ film, the ratio of the $H_2$ gas supplied into the processing container 20 is preferably 20% or more, more preferably 40% or more. In addition, when the ratio of the $H_2$ gas is higher, the etching selective ratio of the natural oxide film is also higher. When the ratio of the $H_2$ gas is 80%, the etching selective ratio of the natural oxide film is 20 or more. However, when the ratio of the $H_2$ gas is higher than 80%, it is difficult to obtain a desired etched amount (2 nm or more) of the natural oxide film within a short time. Therefore, it is preferable that the ratio of the $H_2$ gas is not higher than 80%.

It is preferable that the pressure in the processing container 20 is 0.133 to 6.55 Pa (1 to 50 mTorr). More preferably, the pressure is 0.133 to 2.66 Pa (1 to 20 mTorr)

The total flow amount of the gases is 30 sccm or lower, preferably 20 sccm or lower.

The bias electric power supplied from the high-frequency electric power source 39 to the susceptor is preferably 20 to 700 W. More preferably, it is 100 to 500 W.

The time of the pre-clean process is preferably 10 to 180 second in view of etching in-plane uniformity. More preferably, it is 10 to 120 second.

When any process condition satisfying the above ranges is adopted, the natural oxide film formed on the $CoSi_2$ film can be properly removed.

In addition, the present invention is not limited to the above embodiment, but may be variously modified. For example, in the above embodiment, the natural oxide film is removed by the inductive coupling plasma. However, this invention is not limited thereto, and helicon wave plasma, microwave plasma such as microwave remote plasma, and high-density plasma that may cause less damage by ions can be preferably used. Of course, any other plasma can be also used. In addition, in the above embodiment, the natural oxide film on the $CoSi_2$ film formed on the contact portion of the wafer W is removed. However, this invention is not limited thereto, and a natural oxide film formed on a surface of any other metal or metallic compound film can be removed with a high selective ratio. Such a metal or metallic compound film may be a Co film, a W film, a WSi film, a Cu film, a Si film, an Al film, a Mo film, a MoSi film, a Ni film and a NiSi film. In addition, the present invention can be also used for removing an oxide formed after a polishing step by means of CMP in a wiring-forming process. In addition, in the above embodiment, the Ar gas is used as a noble gas, but Ne, He, Kr and Xe may be also used.

The invention claimed is:

1. A plasma processing method comprising:
   introducing a substrate into a processing container, a $CoSi_2$ film being formed on a surface of the substrate,
   supplying an Ar gas and an $H_2$ gas into the processing container, and
   heating the substrate to 200 to 500° C.,
   generating inductive coupling plasma in the processing container and applying a high-frequency bias voltage to the substrate while the Ar gas and the $H_2$ gas are supplied, so that a natural oxide film formed on a surface of the $CoSi_2$ film is removed by the plasma, wherein
   a total gas flow rate of the Ar gas and the $H_2$ gas is 30 sccm or lower,
   an etching selective ratio of the natural oxide film with respect to the $CoSi_2$ film is 3 or more, and
   in the step of supplying an Ar gas and an $H_2$ gas into the processing container, the $H_2$ gas is supplied in such a manner that a flow rate of the $H_2$ gas is 40% or more with respect to a total gas flow rate.

2. A plasma processing method according to claim 1, wherein
   in the step of removing a natural oxide film, the natural oxide film formed on a surface of the $CoSi_2$ film is reduced by active species of hydrogen and at the same time etched by active species of Ar.

3. A plasma processing method according to claim 1, wherein
   the total gas flow rate of the Ar gas and the $H_2$ gas is 20 sccm or lower.

4. A plasma processing method according to claim 1, wherein
   a frequency for generating the inductive coupling plasma is 450 kHz to 60MHz, and
   a frequency of the high-frequency bias voltage is 13.56 MHz.

5. A plasma processing method according to claim 1, wherein
   a pressure in the processing container is 0.133 to 6.55 Pa.

6. A plasma processing method according to claim 1, wherein
   the time of the step of removing the natural oxide film is 10 to 180 seconds.

7. A plasma processing method comprising:
   introducing a substrate into a processing container, a $CoSi_2$ film being formed on a surface of the substrate,
   supplying an Ar gas and an $H_2$ gas into the processing container, and generating inductive coupling plasma in the processing container and applying a high-frequency bias voltage to the substrate while the Ar gas and the $H_2$ gas are supplied, so that a natural oxide film formed on a surface of the $Cosi_2$ film is removed by the plasma, wherein a total gas flow rate of the Ar gas and the $H_2$ gas is 30 sccm or lower, and an etching selective ratio of the natural oxide film with respect to the $CoSi_2$ film is 3 or more, and in the step of supplying an Ar gas and an $H_2$ gas into the processing container, the $H_2$ gas is supplied in such a maimer that a flow rate of the $H_2$ gas is 40% or more with respect to a total gas flow rate.

* * * * *